(12) United States Patent
Kurotsu

(10) Patent No.: US 7,436,206 B2
(45) Date of Patent: Oct. 14, 2008

(54) SEMICONDUCTOR INTEGRATED CIRCUIT

(75) Inventor: Satoru Kurotsu, Tokyo (JP)

(73) Assignee: Oki Electric Industry Co., Ltd., Tokyo (JP)

( * ) Notice: Subject to any disclaimer, the term of this patent is extended or adjusted under 35 U.S.C. 154(b) by 0 days.

(21) Appl. No.: 11/782,004

(22) Filed: Jul. 24, 2007

(65) Prior Publication Data

US 2008/0094889 A1 Apr. 24, 2008

(51) Int. Cl.
*H03K 17/16* (2006.01)
*H03K 19/094* (2006.01)

(52) U.S. Cl. ............... 326/34; 326/31; 326/81; 327/534; 327/544

(58) Field of Classification Search ........... 326/21, 326/31, 34, 81, 58, 121; 327/534, 544
See application file for complete search history.

(56) References Cited

U.S. PATENT DOCUMENTS 6,242,948 B1 * 6/2001 Makino ............... 326/81
6,285,213 B1 * 9/2001 Makino ............... 326/81

FOREIGN PATENT DOCUMENTS

JP 08-321763 12/1996
JP 11214962 A * 8/1999

* cited by examiner

*Primary Examiner*—Daniel D Chang
(74) *Attorney, Agent, or Firm*—Volentine & Whitt, PLLC

(57) ABSTRACT

The present invention provides an integrated circuit capable of reducing a leak current and reliably holding data therein in a standby mode. A potential higher than a potential of a second source line is supplied to a first source line. A potential lower than a potential of a first ground line is supplied to a second ground line. A virtual source line and a virtual ground line are respectively connected to the second source line and the first ground line by switches in an operation mode and float thereby in the standby mode. Substrates of MOS transistors are respectively connected to the second source line and the first ground line by switches in the operation mode and connected to the first source line and the second ground line thereby in the standby mode. A gate circuit transmits an output signal of a data non-holding circuit to a data holding circuit in the operation mode and fixes an input signal of the data holding circuit in the standby mode.

5 Claims, 4 Drawing Sheets

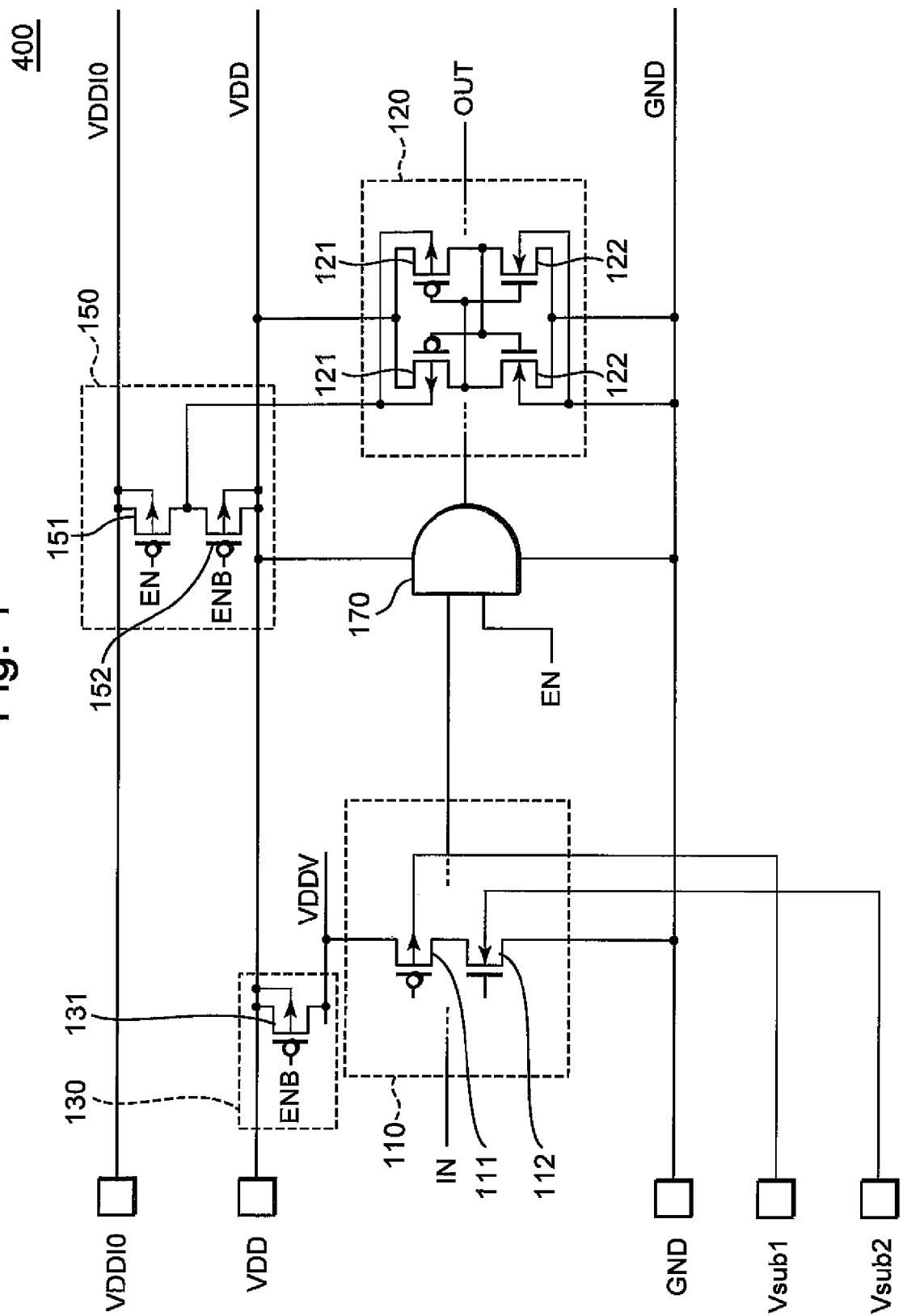

SEMICONDUCTOR INTEGRATED CIRCUIT

BACKGROUND OF THE INVENTION

The present invention relates to a semiconductor integrated circuit having the function of switching between an operation mode and a standby mode. More specifically, the present invention relates to a technique which reduces a leak current without erasing data stored in a logic circuit when a semiconductor integrated circuit is in a standby mode.

There has recently been increasingly growing demand for low power consumption with respect to a semiconductor device. As one factor that will increase power consumption of the semiconductor device, there is known a leak current that flows through each of MOS transistors and diodes which constitute an integrated circuit. The leak current is of a current that flows when each MOS transistor or the like is in an off state or a reverse bias state. In order to suppress the power consumption, the leak current of the integrated circuit is preferably reduced.

As one technique for reducing the leak current, there has been known an MTCMOS (Multi Threshold-Complementary Metal Oxide Semiconductor) technique (refer to, for example, the paragraph 0003 and FIG. 8 in a patent document 1 (Japanese Unexamined Patent Publication No. Hei 8(1996)-321763)). In an MTCMOS integrated circuit of the patent document 1, a logic circuit is constituted of low threshold MOS transistors. Such a logic circuit is connected to a pseudo source line VDDV. Further, the pseudo source line VDDV is connected to a source line VDD via a high threshold MOS transistor Qs. When the logic circuit is in an operation mode, the MOS transistor Qs is turned on to supply power from the source line VDD to the logic circuit. When the logic circuit is in a standby mode, the MOS transistor Qs is turned off to avoid the supply of a source potential to the logic circuit. A MTCMOS integrated circuit (refer to, for example, the paragraph 0003 and FIG. 18 of a patent document 2 (Japanese Unexamined Patent Publication No. Hei 11(1999)-214962)) of the patent document 2 is nearly similar to above.

The MOS transistor is reduced in leak current as its operating threshold value becomes higher but, on the other hand, reduced in operating speed. Thus, in the integrated circuit of the patent document 1, the logic circuit is constituted of the low threshold MOS transistors, and the high threshold MOS transistor is used as a power switch, thereby making a high-speed operation and a leak-current reduction compatible.

As another technique for reducing a leak current, there has been known a VTCMOS (Variable Threshold-Complementary Metal Oxide Semiconductor) technique (refer to, for example, the paragraphs 0030 and 0031 of the patent document 2). In the VTCMOS technique, the potential of a substrate formed with an integrated circuit is reduced in an operation mode and made high in a standby mode or an IDDQ testing (Quiescent Current Testing: test for detecting a variation in process from the value of a quiescent current). Thus, an operating threshold value of each MOS transistor is lowered in the operation mode and made high in the standby mode or the like. Accordingly, the MOS transistor is operated at high speed in the operation mode and small in leak current in the standby mode or the like. A phenomenon that the operating threshold value rises when the substrate potential is set higher than a source potential, is referred to as a substrate bias effect.

However, the conventional MTCMOS technique is accompanied by a drawback that when the power switch (i.e., high threshold MOS transistor which performs connection/disconnection between the pseudo source line and the source line VDD) is turned off and thereby brought to the standby mode, data retained in the logic circuit is erased. If a specific circuit for data storage is added, it is also then possible to prevent disappearance of the retained data in the standby mode. In this case, however, a new drawback occurs in that a circuit scale increases.

The conventional VTCMOS technique is accompanied by drawbacks that since the operating threshold values of all MOS transistors formed in the same substrate are simultaneously changed, the parasitic capacity becomes large and the time required to perform switching between the operation mode and the standby mode becomes longer.

SUMMARY OF THE INVENTION

With the foregoing in view, it is an object of the present invention to provide a semiconductor integrated circuit which is simple in circuit configuration and capable of reliably holding data in a standby mode and which is less reduced in leak current.

According to one aspect of the present invention, for attaining the above object, there is provided a semiconductor integrated circuit comprising a data non-holding circuit corresponding to a logic circuit which unholds data therein in a standby mode, a data holding circuit corresponding to a logic circuit which needs to hold data therein in the standby mode, a virtual high potential source line connected to source electrodes of respective p-type field effect transistors provided within the data non-holding circuit, a first high potential source line connected to source electrodes of respective p-type field effect transistors provided within the data holding circuit, a second high potential source line supplied with a potential higher than a potential of the first high potential source line, a first high potential switch which connects the first high potential source line and the virtual high potential source line in an operation mode and allows the virtual high potential source line to float in the standby mode, a second high potential switch which connects substrate terminals of the respective p-type field effect transistors provided within the data holding circuit and the first high potential source line in the operation mode and connects the substrate terminals and the second high potential source line in the standby mode, and a gate circuit which inputs an output signal of the data non-holding circuit to the data holding circuit in the operation mode and fixes an input signal value of the data holding circuit in the standby mode.

According to the present invention, a gate circuit is provided between a data non-holding circuit and a data holding circuit both corresponding to logic circuits, and an input signal value of the data holding circuit is fixed in a standby mode. Therefore, a semiconductor integrated circuit which is less reduced in leak current and capable of holding data therein in the standby mode, can be obtained with a simple circuit configuration.

BRIEF DESCRIPTION OF THE DRAWINGS

While the specification concludes with claims particularly pointing out and distinctly claiming the subject matter which is regarded as the invention, it is believed that the invention, the objects and features of the invention and further objects, features and advantages thereof will be better understood from the following description taken in connection with the accompanying drawings in which:

FIG. 4 is a circuit diagram showing a configuration of a semiconductor integrated circuit according to a fourth embodiment of the present invention.

DETAILED DESCRIPTION OF THE PREFERRED EMBODIMENTS

Preferred embodiments of the present invention will hereinafter be described with reference to the accompanying drawings. Incidentally, the size, shape and physical relationship of each constituent component in the figures are merely approximate illustrations to enable an understanding of the present invention, and further the numerical conditions explained below are nothing more than mere examples.

First Preferred Embodiment

A semiconductor integrated circuit according to a first embodiment of the present invention will be explained below using FIG. 1.

Figure 1:
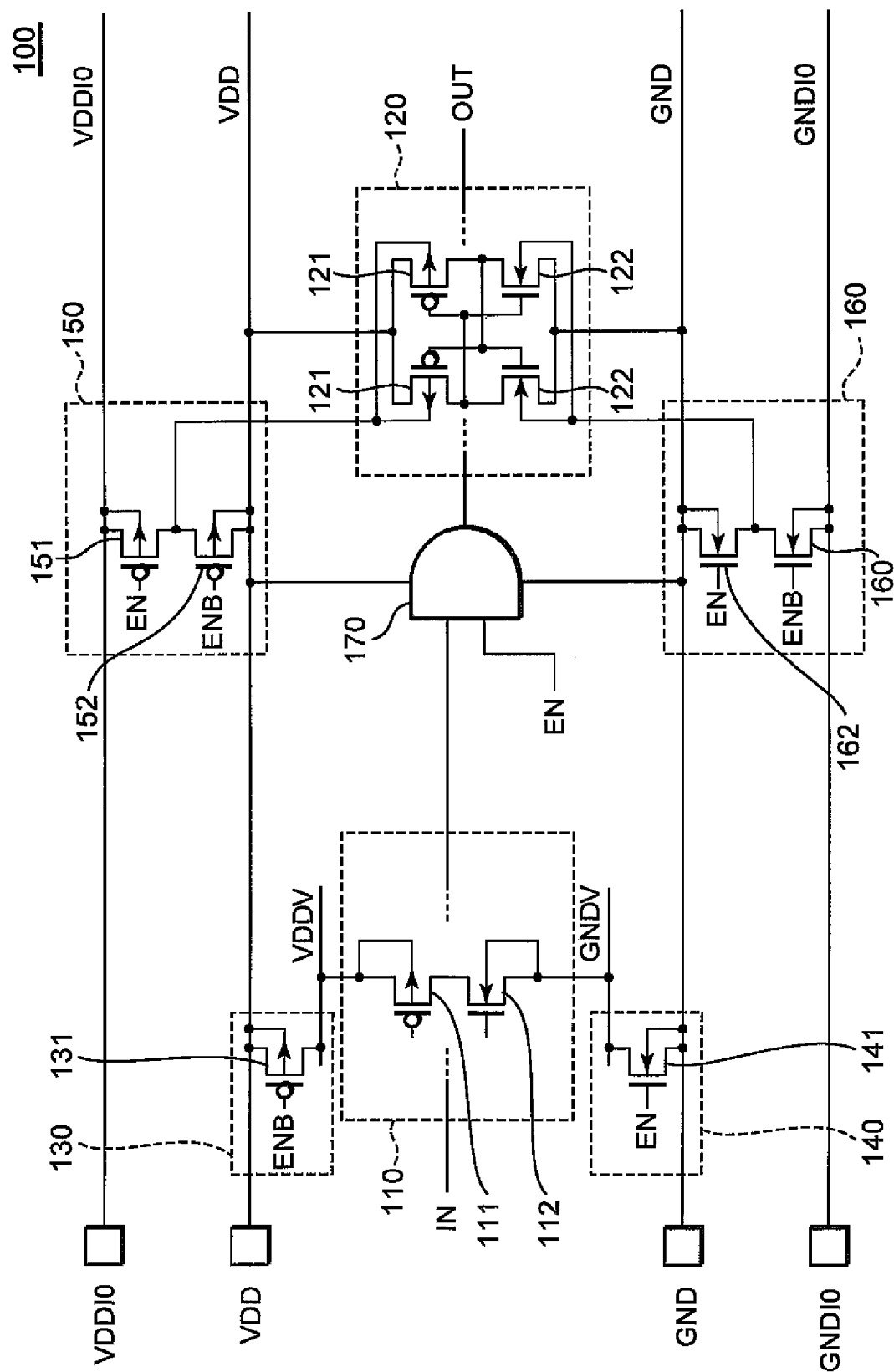
FIG. 1 is a circuit diagram showing a configuration of a semiconductor integrated circuit according to a first embodiment of the preset invention.

As shown in FIG. 1, the semiconductor integrated circuit 100 according to the present embodiment comprises a data non-holding circuit 110, a data holding circuit 120, a virtual source line VDDV, a virtual ground line GNDV, a first source line VDD, a ground line GND, a second source line VDDIO, a second ground line GNDIO, switches 130, 140, 150 and 160 and a gate circuit 170.

The data non-holding circuit 110 is of a logic circuit that does not retain or hold data during a standby mode. The data non-holding circuit 110 is normally configured using a number of low threshold CMOS transistors (pMOS transistors 111 and nMOS transistors 112).

The data holding circuit 120 is of a logic circuit that needs to hold data during the standby mode. The data holding circuit is normally configured using a number of low threshold CMOS transistors (pMOS transistors 121 and nMOS transistors 122).

The virtual source line VDDV is connected to source electrodes and substrate terminals of the respective pMOS transistors 111 provided within the data non-holding circuit 110.

The virtual ground line GNDV is connected to source electrodes and substrate terminals of the respective nMOS transistors 112 provided within the data non-holding circuit 110.

The first source line VDD is connected to source electrodes of the respective pMOS transistors 121 provided within the data holding circuit 120.

The first ground line GND is connected to source electrodes of the respective nMOS transistors 122 provided within the data holding circuit 120.

The second source line VDDIO is supplied with a potential higher than that of the first source line VDD. As will be described later, the second source line VDDIO supplies a substrate potential in the standby mode to the respective pMOS transistors 121.

The second ground line GNDIO is supplied with a potential lower than that of the first ground line GND. As will be described later, the second ground line GNDIO supplies a substrate potential in the standby mode to the respective nMOS transistors 122.

The switch 130 has a pMOS transistor 131. As the pMOS transistor 131, a high threshold pMOS transistor (transistor higher than the pMOS transistors 111 and 121 in threshold) may preferably be used. The pMOS transistor 131 has a source connected to the first source line VDD and a drain connected to the virtual source line VDDV. Further, the pMOS transistor 131 is inputted with an inverse enable signal ENB through its gate. Thus, the switch 130 connects the first source line VDD and the virtual source line VDDV in an operation mode (when an enable signal EN is high in level and the inverse enable signal ENB is low in level, and they are hereinafter ditto as above) and allows the virtual source line VDDV to float in the standby mode (when the enable signal EN is low in level and the inverse enable signal ENB is high in level, and they are hereinafter ditto as above).

The switch 140 has an nMOS transistor 141. As the nMOS transistor 141, a high threshold nMOS transistor (nMOS transistor higher than the nMOS transistors 112 and 122 in operating threshold) may preferably be used. The nMOS transistor 141 has a source connected to the first ground line GND and a drain connected to the virtual ground line GNDV. Further, the nMOS transistor 141 is inputted with the enable signal EN through its gate. Thus, the switch 140 connects the first ground line GND and the virtual ground line GNDV in the operation mode and allows the virtual ground line GNDV to float in the standby mode.

The switch 150 has pMOS transistors 151 and 152. As the pMOS transistors 151 and 152, low threshold pMOS transistors may preferably be used. The pMOS transistor 151 has a source and a substrate terminal connected to the second source line VDDIO and a drain connected to its corresponding substrate terminals of the pMOS transistors 121. Further, the pMOS transistor 151 is inputted with the enable signal EN through its gate. The pMOS transistor 152 has a source and a substrate terminal connected to the first source line VDD and a drain connected to its corresponding substrate terminals of the pMOS transistors 121. Further, the pMOS transistor 152 is inputted with the inverse enable signal ENB through its gate. Thus, the switch 150 connects the substrate terminals of the pMOS transistors 121 provided within the data holding circuit 120 and the first source line VDD in the operation mode, and connects these substrate terminals and the second source line VDDIO in the standby mode.

The switch 160 has nMOS transistors 161 and 162. As the nMOS transistors 161 and 162, low threshold nMOS transistors may preferably be used. The nMOS transistor 161 has a source and a substrate terminal connected to the second ground line GNDIO and a drain connected to its corresponding substrate terminals of the nMOS transistors 122. Further, the nMOS transistor 161 is inputted with the inverse enable signal ENB through its gate. The nMOS transistor 162 has a source and a substrate terminal connected to the first ground line GND and a drain connected to its corresponding substrate terminals of the nMOS transistors 122. Further, the nMOS transistor 162 is inputted with the enable signal EN through its gate. Thus, the switch 160 connects the substrate terminals of the nMOS transistors 122 provided within the data holding circuit 120 and the first ground line GND in the operation mode and connects these substrate terminals and the second ground line GNDIO in the standby mode.

The gate circuit 170 has an AND circuit which has one input terminal connected to its corresponding output terminal of the data non-holding circuit 110 and is inputted the enable signal EN from the other input terminal thereof. Thus, the gate circuit 170 inputs the output of the data non-holding circuit 110 to the data holding circuit 120 in the operation mode and fixes the input of the data holding circuit 120 to a low level in the standby mode. The gate circuit 170 may preferably be constituted of a low threshold transistor. A source and a substrate terminal of a pMOS transistor that constitutes the gate circuit 170 are connected to the first source line VDD, and a source and a substrate terminal of an nMOS transistor thereof are connected to the first ground line GND (not shown).

The operation of the semiconductor integrated circuit 100 shown in FIG. 1 will next be explained with being divided into the operation mode and the standby mode.

The operation thereof in the operation mode will first be described.

When the operation mode is selected, the enable signal EN is set to a high level and the inverse enable signal ENB is set to a low level. Thus, since the transistors 131 and 141 are turned on, the switches 130 and 140 are closed. Accordingly, the virtual source line VDDV and the first source line VDD are connected and the virtual ground line GNDV and the first ground line GND are connected. As a result, in the data non-holding circuit 110, the source of each pMOS transistor 111 is supplied with the potential of the first source line VDD, and the source of each nMOS transistor 112 is supplied with the potential of the first ground line GND.

Further, since the enable signal EN becomes the high level and the inverse enable signal ENB becomes the low level, the pMOS transistor 151 of the switch 150 is turned off and the pMOS transistor 152 thereof is turned on. Thus, the substrate terminals of the pMOS transistors 121 provided within the data holding circuit 120 are connected to the first source line VDD.

Likewise, when the enable signal EN is brought to the high level and the inverse enable signal ENB is brought to the low level, the nMOS transistor 161 of the switch 160 is turned off and the nMOS transistor 162 thereof is tuned on. Thus, the substrate terminals of the nMOS transistors 122 provided within the data holding circuit 120 are connected to the first ground line GND.

Further, since the enable signal EN is rendered high in level, the gate circuit 170 outputs the output of the data non-holding circuit 110 to the data holding circuit 120 as it is.

As described above, the low threshold MOS transistors are used as the circuits 110, 120 and 170. Since the switches 150 and 160 select the first source line VDD and the first ground line GND respectively, the substrate terminals of the MOS transistors 121 and 122 are respectively brought to the same potential as their sources. Thus, no substrate bias effects occur in these MOS transistors 121 and 122. Since the MOS transistors of other circuits 110 and 170 are also the same potential at their substrate terminals and sources, no substrate bias effects occur. Thus, the drive capacities of the MOS transistors that constitute theses circuits 110, 120 and 170 become sufficiently high, so that the circuits 110, 120 and 170 are operated at high speed.

The operation of the semiconductor integrated circuit 100 in the standby mode will next be explained.

When the standby mode is selected, the enable signal EN is set to a low level and the inverse enable signal ENB is set to a high level. Thus, since the transistors 131 and 141 are turned off, the switches 130 and 140 are opened. Consequently, the virtual source line VDDV and the virtual ground line GNDV are respectively brought to a floating state.

Further, since the enable signal EN becomes low in level and the inverse enable signal ENB becomes high in level, the pMOS transistor 151 of the switch 150 is turned on and the pMOS transistor 152 thereof is turned off. Thus, the substrate terminals of the pMOS transistors 121 provided within the data holding circuit 120 are connected to the second source line VDDIO.

Likewise, when the enable signal EN is brought to the low level and the inverse enable signal ENB is brought to the high level, the nMOS transistor 161 of the switch 160 is turned on and the nMOS transistor 162 thereof is turned off. Thus, the substrate terminals of the nMOS transistors 122 provided within the data holding circuit 120 are connected to the second ground line GNDIO.

Further, since the enable signal EN becomes the low level, the output of the gate circuit 170, i.e., the input of the data holding circuit 120 is fixed to the low level.

Since the MOS transistors 131 and 141 in the switches 130 and 140 are respectively formed with high threshold values upon manufacture thereof as mentioned above, a leak current is very small. Thus, when the virtual source line VDDV and the virtual ground line GNDV are caused to float, the current is almost unsupplied to these lines VDDV and GNDV. Accordingly, the current is almost unsupplied to the MOS transistors 111 and 112 provided within the data non-holding circuit 110. Therefore, the MOS transistors 111 and 112 hardly generate an offleak current despite of being the low threshold values.

The MOS transistors 121 and 122 provided within the data holing circuit 120 are respectively formed with the low threshold values in a manufacturing process. However, the substrate terminals of the MOS transistors 121 and 122 are connected to the second source line VDDIO and the second ground line VDDIO in the standby mode. Therefore, the substrate potential becomes higher than the source potential at each pMOS transistor 121, and the substrate potential becomes lower than the source potential at each nMOS transistor 122. Thus, the operating threshold values of these MOS transistors 121 and 122 increase with the substrate bias effects. As a result, the offleak currents of the MOS transistors 121 and 122 can also be held down.

Since the sources of the MOS transistors 121 and 122 are supplied with the potentials from the first source line VDD and the first ground line GND in the same manner as in the operation mode, the data retained by the data holding circuit 120 in the operation mode is maintained as it is.

Since, however, the virtual source line VDDV and the virtual ground line GNDV float as described above, the source potentials of the MOS transistors 111 and 112 are not held constant. Hence, the value of the output signal of the data holding circuit 110 also becomes unconstant. On the other hand, when the MOS transistors or each data holding section provided within the data holding circuit 120 constitutes a sequence circuit (latch circuit or the like), the data held therein is determined depending upon the past input signal values. Therefore, when the undefined value of the data non-holding circuit 110 is inputted as it is, the data holding circuit 120 has a risk of causing a malfunction after having been returned to the operation mode. On the other hand, in the present embodiment, the malfunction of the data holding circuit 120 becomes hard to occur because the gate circuit 170 is provided and the input signal value of the data holding circuit 120 is fixed to the low level.

In the semiconductor integrated circuit 100 according to the present embodiment as described above, the logic circuits are provided with being divided into the data non-holding circuit 110 and the data holding circuit 120 and constituted of the low threshold MOS transistors. In the standby mode, each substrate terminal of the data holding circuit 120 is supplied with the potential higher than that in the operation mode, and the output of the data non-holding circuit 110 and the input of the data holding circuit 120 are cut off using the gate circuit 170. Thus, according to the present embodiment, a semiconductor integrated circuit capable of reducing the leak current in the standby mode and holding the data reliably can be materialized with a simple circuit configuration.

Since the logic circuits 110 and 120 are respectively constituted of the low threshold MOS transistors, they can be operated at high speed in the operation mode.

In addition, since the substrate bias effects occur only in the data holding circuit 120, the influence of parasitic capacity is reduced as compared with the conventional VTCMOS. Thus, the time required to perform switching between the operation mode and the standby mode can be shortened.

Second Preferred Embodiment

A semiconductor integrated circuit according to a second embodiment of the present invention will next be explained using FIG. 2.

Figure 2:
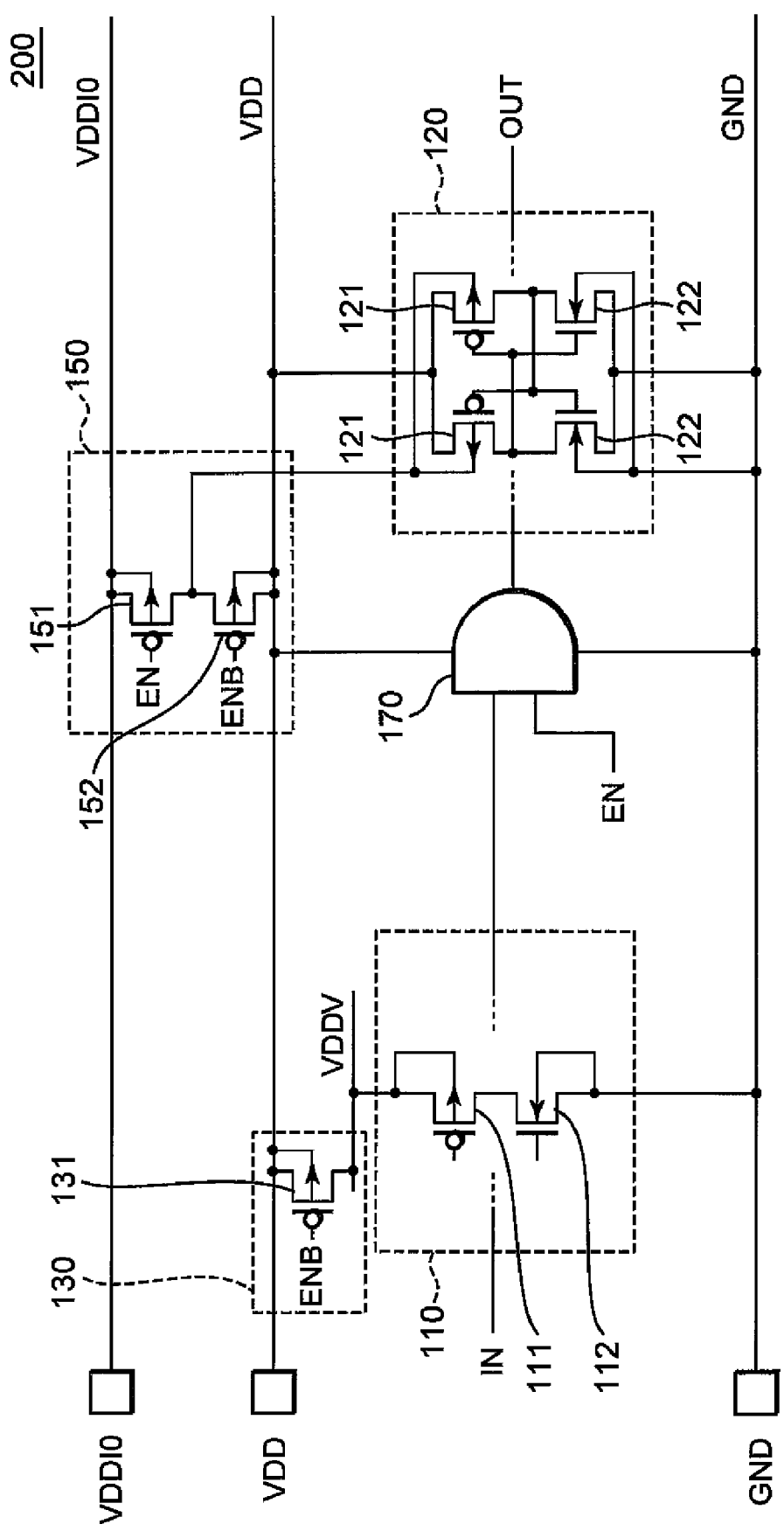
FIG. 2 is a circuit diagram illustrating a configuration of a semiconductor integrated circuit according to a second embodiment of the present invention.

In FIG. 2, constituent elements respectively given the same reference numbers as those in FIG. 1 respectively indicate ones identical to those shown in FIG. 1.

As shown in FIG. 2, the semiconductor integrated circuit 200 according to the present embodiment is not provided with the switches 140 and 160, the virtual ground line GNDV and the second ground line GNDIO. And the sources and substrate terminals of nMOS transistors 112 and 122 are always or continuously connected to a first ground line GND.

The operation of the semiconductor integrated circuit 200 shown in FIG. 2 will next be explained with being divided into an operation mode and a standby mode.

The operation thereof in the operation mode will first be described.

When the operation mode is selected, an enable signal EN is set to a high level and an inverse enable signal ENB is set to a low level. Thus, since a transistor 131 is turned on, a switch 130 is closed. Accordingly, a virtual source line VDDV and a first source line VDD are connected. As a result, in a data non-holding circuit 110, the source of each pMOS transistor 111 is supplied with the potential of the first source line VDD. In the present embodiment as described above, the source of each nMOS transistor 112 is supplied with the potential of the first ground line GND.

Since the enable signal EN becomes the high level and the inverse enable signal ENB becomes the low level, a pMOS transistor 151 of a switch 150 is turned off and a pMOS transistor 152 thereof is turned on. Thus, the substrate terminal of each pMOS transistor 121 provided within a data holding circuit 120 is connected to the first source line VDD.

On the other hand, in the present embodiment as mentioned above, the substrate terminal of each nMOS transistor 122 is connected to the first ground line GND.

Further, since the enable signal EN becomes the high level, a gate circuit 170 outputs the output of the data non-holding circuit 110 to the data holding circuit 120 as it is.

As described above, low threshold MOS transistors are used as the circuits 110, 120 and 170. The substrate terminals of the MOS transistors 121 and 122 are respectively the same potential as their sources. Thus, no substrate bias effects occur in these MOS transistors 121 and 122. Since the MOS transistors of other circuits 110 and 170 are also the same potential at their substrate terminals and sources, no substrate bias effects occur. Thus, the drive capacities of the MOS transistors that constitute theses circuits 110, 120 and 170 become sufficiently high, so that the circuits 110, 120 and 170 are operated at high speed.

The operation of the semiconductor integrated circuit 200 in the standby mode will next be explained.

When the standby mode is selected, the enable signal EN is set to a low level and the inverse enable signal ENB is set to a high level. Thus, since the transistor 131 is turned off, the switch 130 is opened. Consequently, the virtual source line VDDV is brought to a floating state.

Since the enable signal EN becomes low in level and the inverse enable signal ENB becomes high in level, the pMOS transistor 151 of the switch 150 is turned on and the pMOS transistor 152 thereof is turned off. Thus, the substrate terminals of the pMOS transistors 121 provided within the data holding circuit 120 are connected to a second source line VDDIO.

Further, since the enable signal EN becomes the low level, the output of the gate circuit 170, i.e., the input of the data holding circuit 120 is fixed to the low level.

Since the MOS transistor 131 in the switch 130 is formed with a high threshold value upon manufacture thereof in such a state, a leak current is very small. Thus, when the virtual source line VDDV is caused to float, the current is almost unsupplied to the virtual source line VDDV. Accordingly, the current is almost unsupplied to the MOS transistors 111 provided within the data non-holding circuit 110. Therefore, each MOS transistor 111 hardly generates an offleak current despite of being a low threshold value. Here, in the present embodiment as described above, the source of each nMOS transistor 112 does not float even in the standby mode because of being connected to the first ground line GND. Since, however, the source of the pMOS transistor 111 is almost unsupplied with the current, the current is hardly supplied even to the drain of the nMOS transistor 112. Thus, the offleak current is hardly generated even in the nMOS transistor 112.

In the data holding circuit 120 as described above, the substrate terminals of the pMOS transistors 121 are connected to the second source line VDDIO. Therefore, a substrate potential becomes higher than a source potential at the pMOS transistor 121. Thus, the operating threshold value of the pMOS transistor 121 increases with the substrate bias effects. As a result, the pMOS transistors 121 are very low in offleak current despite they are formed with low threshold values in a manufacturing process. Since the offleak current of each pMOS transistor 121 hardly flows, the current is hardly supplied to the drain of each pMOS transistor 122. Thus, the offleak current hardly flows through the nMOS transistor 122 despite its operating threshold is low and the substrate bias effects are not produced.

Since the sources of the MOS transistors 121 and 122 are respectively supplied with the potentials from the first source line VDD and the first ground line GND in the same manner as in the operation mode, data retained by the data holding circuit 120 in the operation mode is maintained as it is. Since the gate circuit 170 fixes a signal value inputted to the data holding circuit 120, the malfunction of the data holding circuit 120 is hard to occur.

According to the semiconductor integrated circuit 200 according to the present embodiment as described above, an effect similar to the first embodiment can be obtained with a circuit configuration simpler than that of the first embodiment. It is, thus, possible to reduce a chip area as compared with the first embodiment.

In addition, according to the present embodiment, there is no need to adopt a triple well structure upon its construction in semiconductor chip form because one type of ground potential may be used. Accordingly, a reduction in manufacturing cost becomes easy.

Third Preferred Embodiment

A semiconductor integrated circuit according to a third embodiment of the present invention will next be explained using FIG. 3.

Figure 3:
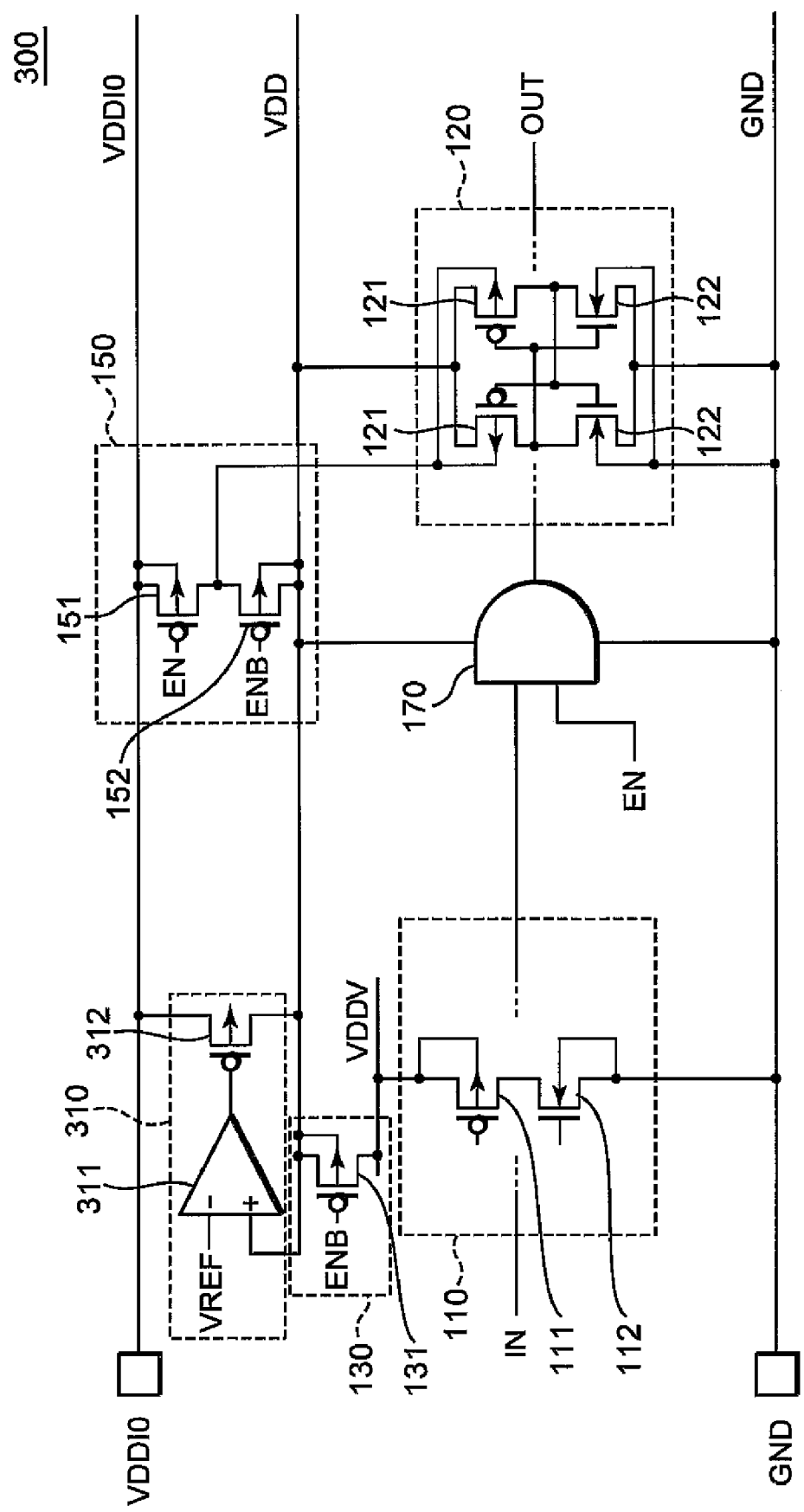
FIG. 3 is a circuit diagram depicting a configuration of a semiconductor integrated circuit according to a third embodiment of the present invention.

In FIG. 3, constituent elements respectively given the same reference numbers as those in FIGS. 1 and 2 respectively indicate ones identical to those shown in FIGS. 1 and 2.

As shown in FIG. 3, the semiconductor integrated circuit 300 according to the present embodiment is different from that according to the second embodiment in that a first source line VDD is not connected to an external terminal and a voltage regulator 310 is provided.

The voltage regulator 310 includes a differential amplifier 311 and a pMOS transistor 312.

The differential amplifier 311 has a +input terminal connected to the first source line VDD and is inputted with a reference potential VREF from a −input terminal thereof. Thus, the differential amplifier 311 outputs a potential corresponding to VDD−VREF.

The pMOS transistor 312 has a source connected to a second source line VDDIO, a drain connected to the first source line VDD and a gate connected to an output terminal of the differential amplifier 311.

At power-on of the semiconductor integrated circuit 300 under such a configuration, a potential is first supplied to the second source line VDDIO, and the reference potential is inputted to the −input terminal of the differential amplifier 311.

Thus, the differential amplifier 311 outputs a potential corresponding to the different in potential between the reference potential and the potential of the first source line VDD to the gate of the pMOS transistor 312.

The pMOS transistor 312 is turned on when the output potential of the differential amplifier 311 is inputted thereto from the gate thereof. Thus, since the current flows from the second source line VDDIO to the first source line VDD, the potential of the first source line VDD rises.

As the potential of the first source line VDD rises, the input potential difference VDD−VREF of the differential amplifier 311 gradually decreases. Thus, the output potential of the differential amplifier 311 is also gradually reduced. Therefore, the potential at the gate of the pMOS transistor 312 is also gradually reduced.

When the output potential of the differential amplifier 311 becomes lower than the operating threshold value of the pMOS transistor 312, the pMOS transistor 312 is turned off so that the supply of the current from the second source line VDDIO to the first source line VDD is stopped.

Thus, the potential of the first source line VDD is stabilized to the value corresponding to the reference potential VREF.

Thereafter, the semiconductor integrated circuit 300 proceeds to an operation mode or a standby mode similar to the second embodiment. While, at this time, the current is supplied from the first source line VDD to a data non-holding circuit 110 and a data holding circuit 120, the pMOS transistor 312 is turned on when the potential of the first source line VDD is made lower than a predetermined potential (potential defined by the reference potential VREF). Accordingly, the potential of the first source line VDD is stabilized to such a predetermined potential even in the operation and standby modes.

According to the semiconductor integrated circuit 300 according to the present embodiment, an effect that since one power system may be used, the semiconductor integrated circuit 300 can be mounted to a single power system in addition to an effect similar to that of the semiconductor integrated circuit 200 according to the second embodiment.

Fourth Preferred Embodiment

A semiconductor integrated circuit according to a fourth embodiment of the present invention will next be explained using FIG. 4.

In FIG. 4, constituent elements respectively given the same reference numbers as those in FIGS. 1 and 2 respectively indicate ones identical to those shown in FIGS. 1 and 2.

As shown in FIG. 4, the semiconductor integrated circuit 400 according to the present embodiment is different from that according to the second embodiment in that substrate potentials Vsub1 and Vsub2 of MOS transistors 111 and 112 provided within a data non-holding circuit 110 are supplied from outside.

The above-described MTCMOS technique (refer to each of the patent documents 1 and 2) is accompanied by the drawback that the IDDQ testing cannot be carried out due to the above reasons because the MOS transistors very low in operating threshold are included.

The IDDQ testing is a test that measures a source current value at the time that the CMOS circuit is in a stationary or quiescent state, thereby to determine the quality of a semiconductor chip. When a defect in silicon occurs in a current path from the power source of a semiconductor integrated circuit to ground, a current value measured on the IDDQ testing becomes very high.

In order to perform the accurate IDDQ testing, an offleak current value of the CMOS circuit must be made small sufficiently. This is because when the offleak current is large, the accurate source current value cannot be measured. Thus, the abovementioned conventional MTCMOS circuit could not perform the IDDQ testing because the low threshold MOS transistors were used.

On the other hand, in the semiconductor integrated circuit 400 according to the present embodiment, the operating threshold values of the MOS transistors 111 and 112 provided within the data non-holding circuit 110 can be made sufficiently high by setting the substrate potentials Vsub1 and Vsub2 of the MOS transistors 111 and 112 to suitable potentials respectively. Setting an enable signal EN to a low level and an inverse enable signal ENB to a high level makes it possible to sufficiently raise the operating threshold values of MOS transistors 121 and 122 provided within a data holding circuit 120. Thus, according to the semiconductor integrated circuit 400 according to the present embodiment, the accurate IDDQ testing can be carried out while the offleak current is being sufficiently suppressed, regardless of the provision of the MTCMOS circuit.

According to the semiconductor integrated circuit 400 according to the present embodiment as described above, it has an effect that the IDDQ testing can be done, in addition to an effect similar to that of the semiconductor integrated circuit 200 according to the second embodiment.

While the preferred forms of the present invention have been described, it is to be understood that modifications will be apparent to those skilled in the art without departing from the spirit of the invention. The scope of the invention is to be determined solely by the following claims.

What is claimed is:

1. A semiconductor integrated circuit comprising:
   a data non-holding circuit corresponding to a logic circuit which unholds data therein in a standby mode;
   a data holding circuit corresponding to a logic circuit which needs to hold data therein in the standby mode;

a virtual high potential source line connected to source electrodes of respective p-type field effect transistors provided within the data non-holding circuit;

a first high potential source line connected to source electrodes of respective p-type field effect transistors provided within the data holding circuit;

a second high potential source line supplied with a potential higher than a potential of the first high potential source line;

a first high potential switch which connects the first high potential source line and the virtual high potential source line in an operation mode and allows the virtual high potential source line to float in the standby mode;

a second high potential switch which connects substrate terminals of the respective p-type field effect transistors provided within the data holding circuit and the first high potential source line in the operation mode and connects the substrate terminals and the second high potential source line in the standby mode; and a gate circuit which inputs an output signal of the data non-holding circuit to the data holding circuit in the operation mode and fixes an input signal value of the data holding circuit in the standby mode.

2. The semiconductor integrated circuit according to claim 1, further comprising:

a virtual low potential source line connected to source electrodes of respective n-type field effect transistors provided within the data non-holding circuit;

a first low potential source line connected to source electrodes of respective n-type field effect transistors provided within the data holding circuit;

a second low potential source line supplied with a potential lower than a potential of the first low potential source line;

a first low potential switch which connects the first low potential source line and the virtual low potential source line in the operation mode and allows the virtual low potential source line to float in the standby mode; and a second low potential switch which connects substrate terminals of the respective n-type field effect transistors provided within the data holding circuit in the operation mode and connects the substrate terminals and the second low potential source line in the standby mode.

3. The semiconductor integrated circuit according to claim 1, further comprising a low potential source line connected to the source electrodes and substrate terminals of the respective n-type field effect transistors respectively provided within the data non-holding circuit and the data holding circuit.

4. The semiconductor integrated circuit according to any of claims 1, further comprising a voltage regulator including a differential amplifier which outputs a potential corresponding to a difference between the potential of the first high potential source line and a reference potential, and a voltage supply field effect transistor which has one end connected to the first high potential source line, the other end connected to the second high potential source line and a control terminal inputted with the potential outputted from the differential amplifier.

5. The semiconductor integrated circuit according to claim 3, wherein each of the substrate terminals of the respective field effect transistors provided within the data non-holding circuit is connected to an external terminal which inputs a substrate control potential from outside.

* * * * *